(12) United States Patent
Mankame et al.

(10) Patent No.: US 6,491,330 B1
(45) Date of Patent: Dec. 10, 2002

(54) EDGE GRIPPING END EFFECTOR WAFER HANDLING APPARATUS

(75) Inventors: Anil Mankame, Attleboro, MA (US); Anthony Florindi, Medfield, MA (US); Fredrick Arnold Goodman, Brookline, MA (US)

(73) Assignee: Ade Corporation, Westwood, MA (US)

( * ) Notice: Subject to any disclaimer, the term of this patent is extended or adjusted under 35 U.S.C. 154(b) by 0 days.

(21) Appl. No.: 09/565,035

(22) Filed: May 3, 2000

Related U.S. Application Data (60) Provisional application No. 60/132,455, filed on May 4, 1999.

(51) Int. Cl.$^7$ .................................................. B25J 15/08
(52) U.S. Cl. ...................... 294/88; 294/99.1; 294/103.1; 294/902; 414/941; 901/37; 901/39
(58) Field of Search ........................... 294/1.1, 34, 86.4, 294/88, 99.1, 100, 103.1, 104, 119.1, 119.3, 902, 907; 318/568.21; 414/741, 744.8, 751.1, 783, 939, 941; 901/36, 37, 39, 46

(56) References Cited

U.S. PATENT DOCUMENTS

| | | | | |
|---|---|---|---|---|
| 3,967,946 A | * | 7/1976 | Campbell | 294/902 X |
| 4,141,458 A | | 2/1979 | Brooks et al. | 214/301 |
| 4,410,209 A | * | 10/1983 | Trapani | 294/103.1 X |
| 4,745,812 A | | 5/1988 | Amazeen et al. | 73/862.04 |
| 4,762,353 A | | 8/1988 | Molinaro | 294/1.1 |
| 4,854,623 A | | 8/1989 | Molinaro | 294/1.1 |
| 4,872,803 A | * | 10/1989 | Asakawa | 294/99.1 X |
| 4,900,214 A | * | 2/1990 | Ben | 294/103.1 X |
| 4,944,650 A | * | 7/1990 | Matsumoto | 294/103.1 X |
| 4,971,512 A | * | 11/1990 | Lee et al. | 294/103.1 X |
| 5,046,773 A | * | 9/1991 | Modesitt | 294/907 X |
| 5,429,251 A | | 7/1995 | Matthews | 211/41 |
| 5,613,821 A | | 3/1997 | Muka et al. | 414/217 |
| 5,711,646 A | * | 1/1998 | Ueda et al. | 414/941 X |
| 5,765,983 A | | 6/1998 | Caveney et al. | 414/217 |
| 5,778,554 A | | 7/1998 | Jones | 34/58 |
| 5,810,549 A | | 9/1998 | Wytman | 414/786 |
| 6,155,773 A | * | 12/2000 | Ebbing et al. | 294/103.1 X |
| 6,283,701 B1 | * | 9/2001 | Sundar et al. | 294/103.1 X |

OTHER PUBLICATIONS

US 6,227,585, 5/2001, Govzman et al. (withdrawn)*

* cited by examiner

*Primary Examiner*—Johnny D. Cherry
(74) *Attorney, Agent, or Firm*—Weingarten, Schurgin, Gagnebin & Lebovici LLP (57) ABSTRACT

An edge-gripping wafer handling apparatus for holding and transporting wafers in a clean room environment is implemented by mounting gripping fingers on a paddle arm adapted to be controlled by a robot. At the free end of the paddle arm, a plurality of fixed fingers is mounted. Each of these fixed fingers includes a notch for gripping the edge of a wafer. A moving finger is mounted close to the fixed end of the paddle arm. The moving finger can be smoothly moved to engage the edge of the wafer and cause the opposite edge of the wafer to engage the fixed fingers. The movement of the moving finger is caused by a bellows flexing a hinge connected to the finger. The flexing hinge is formed as a parallelogram of two stable ends and two flexing arms. The movement of the hinge is smooth and causes no particulate matter to be generated due to rubbing or other friction generating mechanism.

38 Claims, 7 Drawing Sheets

EDGE GRIPPING END EFFECTOR WAFER HANDLING APPARATUS

CROSS REFERENCE TO RELATED APPLICATIONS

This application claims priority under 35 U.S.C. 119(e) to U.S. provisional patent application No. 60/132,455, filed May 4, 1999, entitled EDGE GRIPPING END EFFECTOR FOR SILICON WAFER HANDLING, incorporated herein by reference.

STATEMENT REGARDING FEDERALLY SPONSORED RESEARCH OR DEVELOPMENT

Not Applicable

BACKGROUND OF THE INVENTION

Silicon wafers for semiconductor production pass through many steps in transitioning from a slice of silicon to a collection of functional integrated circuits on a silicon wafer. Between many of these steps the wafers must be removed from a cassette, have their orientation changed, be placed in fixtures and be transported to the next step. All of these operations are performed in a clean room. One of the present technologies in wafer handling uses backside contact by vacuum grippers. This technology requires that there be a front side of the wafer and a backside with the backside subject to being handled by the vacuum grippers. A second technology in wafer handling grips the wafers by the edges but is subject to sudden exertions of force and mechanism wear that cause contamination. Both of these technologies have suffered from wafer jams when inserting and removing the wafers from the cassette, the wafer protrusion problem—misalignment of the wafers in the cassette, and contaminants getting on the wafer from breakdown of the transport mechanism.

BRIEF SUMMARY OF THE INVENTION

The present invention relates to handling of silicon wafers and in particular to edge grip handling of silicon wafers.

A stable edge grip on a wafer can be maintained if there are at least three points of contact between the gripper and the wafer. The force imparted by the three points of contact must be sufficient to counterbalance the weight of the wafer, but must not be so large as to bend the wafer significantly. At least three edge gripping fingers are mounted on a paddle such that the entire paddle/finger assembly can fit between wafers in a cassette. At least two of the edge gripping fingers are fixed at one end of the paddle in a separated relationship and passively respond to pressure brought to bear on them by the wafer. A single finger is mounted on the other end of the paddle and exhibits linear motion. The arrangement of the fingers on opposite sides of the wafer leaves the edges along the axis of the paddle arm free. The movable finger is brought into contact with the wafer by a flexure hinge driven by compressible fluid. Because there is no rubbing motion in the mechanism of the flexure hinge, the mechanism does not wear, does not have backlash or creep-like error motions, and no particulate contaminants are generated. In addition, the use of a compressible fluid mechanism assures that a smooth steady motion is imparted to the moving finger.

In picking up a wafer, the paddle/finger assembly is slid beneath the target wafer until the two fixed fingers are just past the edge of the wafer. The assembly is then raised so that the wafer and gripping surface of all the fingers are approximately aligned. The moving finger then moves toward the wafer until it exerts sufficient force on the wafer to bring the far side of the wafer in contact with the fixed fingers. The moving finger is maintained in the contact position throughout the withdrawal from the cassette and during any transport.

The release of the wafer is accomplished by reversing the steps of pickup. The moving finger breaks contact with the wafer, releasing the force on the wafer. A flexure tip on the fixed fingers nudges the wafer away from edge gripping surfaces of the fixed fingers. Then the paddle/finger assembly is lowered and withdrawn from the proximity of the wafer.

BRIEF DESCRIPTION OF THE SEVERAL VIEWS OF THE DRAWING

The invention as disclosed herein will be more fully understood by reference to the following detailed description and drawings, of which.

DETAILED DESCRIPTION OF THE DRAWINGS

The advantages of edge gripping silicon wafers come about because gripping by the edge frees both surfaces for processing. The surfaces are not contaminated nor are they obscured by the gripping fingers. In addition, by gripping the edges of a wafer, the wafer itself can be precisely placed in a fixture without the probability that it will shift.

Figure 1:
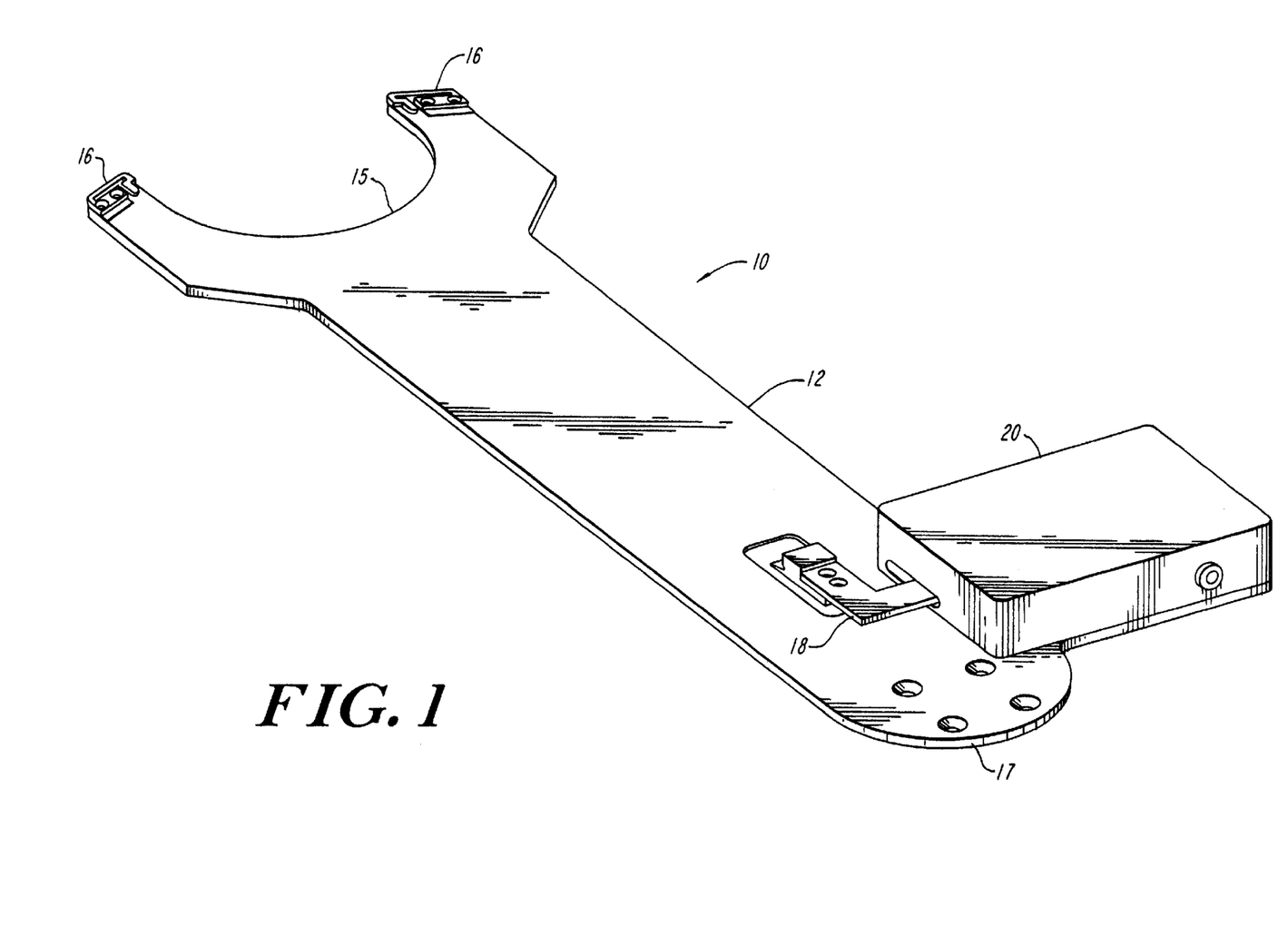
FIG. 1 shows the paddle, fixed fingers and moving finger.

The general concept of the invention is that fingers will be used to grip the edge of the wafers. Such fingers are to be spread around the periphery of the wafer. Only one finger will be actively driven by any mechanism. The mechanism is based on the bending of a structure that causes no rubbing or other friction. The fixed fingers utilized to grip the wafer will have a passive response rather than being inert. An implementation of such an invention is illustrated in FIG. 1. The paddle arm-finger assembly 10 is composed of a paddle arm 12 upon which are mounted a plurality of fixed fingers 16 and the mechanism 20 for moving a movable finger 18. The paddle 12 has a throw sufficient to place the fingers on opposite sides of a wafer. The paddle arm/finger assembly 10 height is compact enough to allow the paddle to be placed between wafers or beneath a wafer and engage the wafer from below. p The implementation illustrated in FIG. 1 utilizes two fixed fingers 16 at the distal end 15 of the paddle 12 in a spaced relationship so that the two fixed fingers 16 and the moving finger 18 form a triangle of contacts around the edge of any wafer. At the proximate end 17 of the paddle, arm, the moving finger 18 is attached to a mechanism covered by a housing 20, the mechanism being permanently fixed to the proximate end 17. The moving finger 18 is moved such that the distance between the moving finger 18 and the fixed fingers 16 is decreased when the mechanism is actuated.

Figure 2:
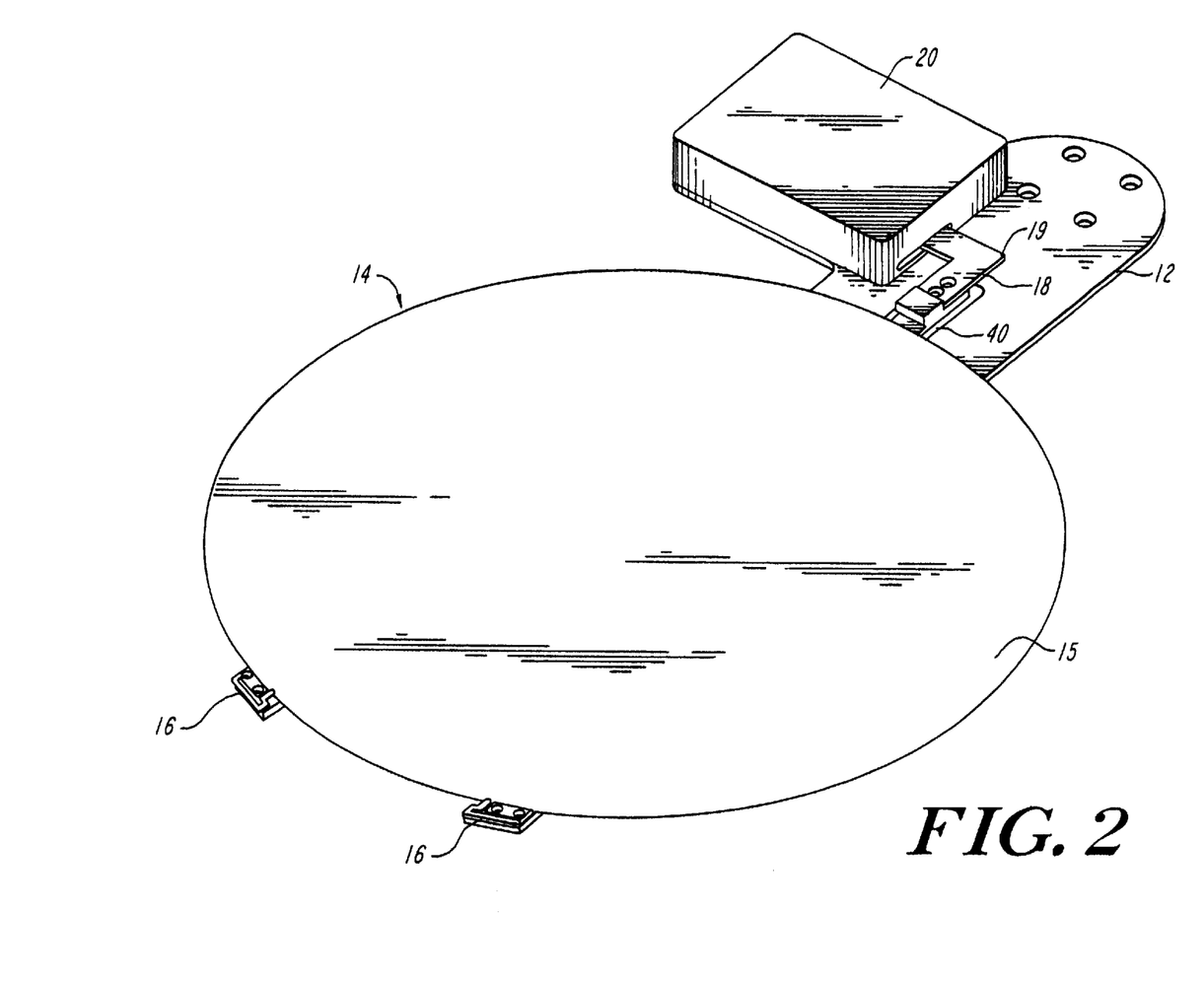
FIG. 2 shows the paddle, fixed fingers and moving finger securing a wafer.

When a wafer 15 is engaged by the paddle arm/finger assembly 10 as illustrated in FIG. 2, the edge of the wafer 14 is engaged by the fixed fingers 16 and the finger tip 40 mounted on the moving finger 18. Once the fingers 16 and 18 have gripped the wafer, the entire paddle arm/finger assembly 10 can move to transport the wafer as needed and as programmed into a robot which moves the paddle arm.

Figure 3:
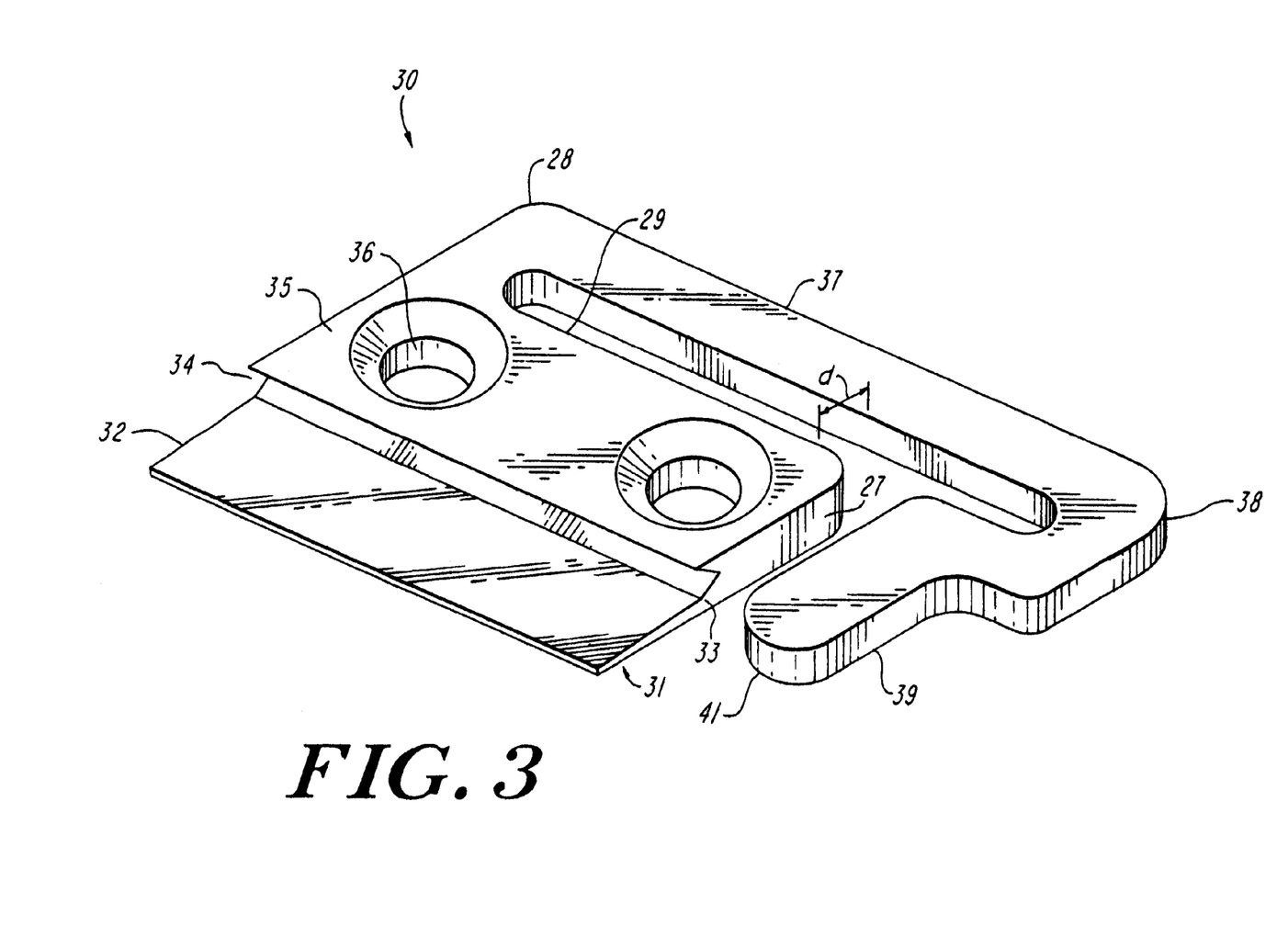
FIG. 3 shows a fixed finger flexure fixture.

The detail of the fixed finger 30 that is fixed at the distal end 15 of the paddle arm 12 is shown in FIG. 3. The fixed finger 30 is composed of a body 35 and a flexible portion 37. The body 35 is positioned on the paddle such that a first face 33 faces the wafer. The face 33 is composed of two parts; a notch 34 in the top portion and inclined plane 32 in the lower portion. The body 35 is secured to the paddle 12 by its bottom surface 31. In FIG. 3, the mounting means illustrated is a set of holes 36 for bolts to pass through, securing the body 35 to the paddle 12. The flexible portion 37 of the fixed finger is parallel to the back radial face 29 of the body 35. The flexible portion 37 has a fixed end 28, fixed to the body 35 on the back radial face 29 and spacing the remainder of the flexible portion 37 from the body 35 by a distance. The flexible portion 37 runs parallel to the back radial face 29 of the body 35 and a flexible finger 39 extends perpendicular to the flexible portion 37 and runs parallel to the side 27 of the body. The flexible finger 39 extends at least to the outer edge of notch 34 and is terminated in a flexure tip 41.

The entire fixed finger is made of a resilient material so that a force pushing against flexure tip 37 will displace the flexible portion. In a preferred embodiment, the fixed finger is a molded piece of polymer, preferably Poly Ether Ether Ketone (PEEK). Alternately, the fixed finger can be machined from PEEK. Using PEEK to manufacture the fixed finger is preferred because it does not deteriorate, which could create particulate matter to contaminate wafers, and because it exhibits a suitable springiness to implement the flexure tip.

The body 35 of the fixed finger is secured to the paddle using bolts passing through holes 36 to fasten the body 35 to the paddle 12. The inclined plane 32 serves as a lead-in to guide the edge 14 of the wafer 15 toward the notch 34. The notch 34 has a span greater than the thickness of the wafer 15 and a depth sufficient to grip the wafer 15 at two points on the notch 34.

The flexible portion 37 of the fixed finger 30 is fixed to the body 35 and spaced apart from it by a small bridge portion 28. The center of the bridge portion 28 serves as a pivot point for the flexible portion 37. The flexible portion 37 extends the width of the body 35 and when it has cleared the body, a flexible finger 39 extends perpendicular to the flexible portion 37. While a 90° angle may be used to join the flexible finger 39 to the flexible portion 37, more complex curves serving the same function may be used such as the one illustrated in FIG. 3. Such complex curves are designed to allow the springiness of the flexure tip 41 to be calibrated to respond to the force that will be applied by the opposing moving finger 19. The length of the flexible finger 39 is selected to be approximately flush with the edges of the notch 34. When the paddle 12 is brought in contact with a wafer 15, the flexible tip 41 is in contact with the edge 14 of the wafer 15.

Figures 4, 5:
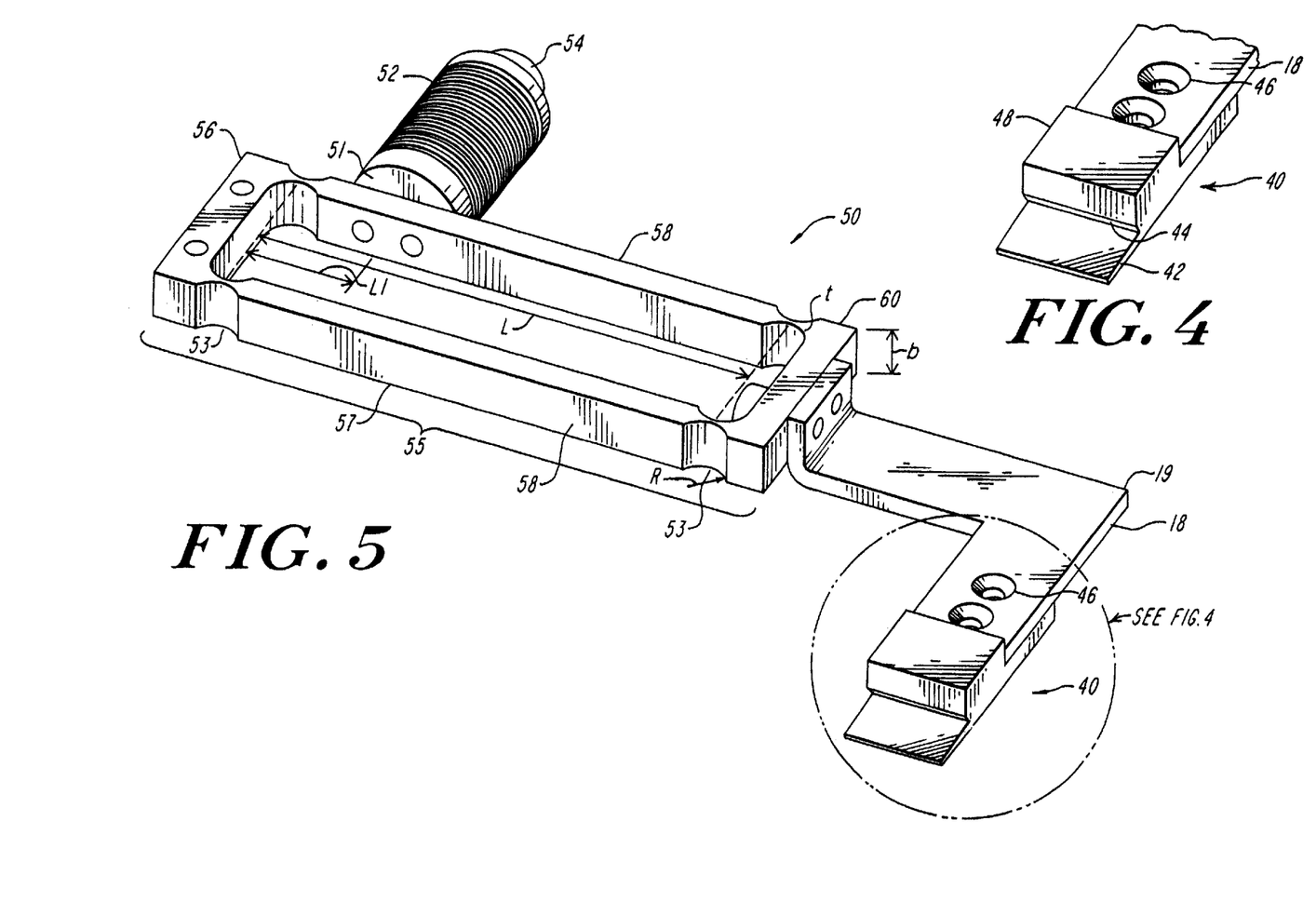
FIG. 4 shows the moving finger tip.
FIG. 5 shows a flexure hinge supporting the moving finger with a bellows attached.

The moving-finger tip 40 is illustrated in FIG. 4. It has a body 48, mounting holes 46, inclined plane 42 and an upper portion 44 of its radial face. In a preferred embodiment, the moving-finger tip is a molded piece of polymer, preferably Poly Ether Ether Ketone (PEEK). Using PEEK to manufacture the moving-finger tip is preferred because it does not deteriorate, which could create particulate matter to contaminate wafers. The mounting holes 46 secure the moving-finger tip 40 to the moving finger 18 that is connected to the mechanism that will move the finger tip 40. The inclined plane 42 serves as a lead in, like the lead in on the fixed finger, and leads the wafer to the upper portion 44 of the body 48. The upper portion 44 of the body 48 can be shaped as a notch identical to the notch of the fixed finger 30 or can be an alternate shape. In a preferred embodiment, the upper portion is shaped as a V-shaped notch.

The moving-finger tip 40 is mounted to an effector mechanism 50 as shown in FIG. 5. The effector mechanism 50 is composed of a flexure hinge 55 and bellows 52. The flexure hinge 55 is composed of a set of stable ends 56 and 60 connected by a pair of flexible arms 58 forming a rectangle when no force is applied. Flexible arms 58 are composed of a straight length 57 terminated at each end by a flexure notch 53. A bellows 52 is mounted on one flexible arm 58 near the junction with a stable end. First stable end 56 mounts the flexure hinge 55 and second stable end 60, has mounted to it the moving finger 18. Depending on the orientation of the mechanism to the moving finger, the moving finger 18 may incorporate a right angle 19 that causes the moving finger tip 40 to travel in the same direction as the second stable end 60. The flexure notches 53 in the flexible arms 58 permit the flexible arms 58 to be deflected. Bellows 52 has a sealed end 51 and has a compressible fluid input port 54 at the second end. Sealed end 51 is mounted to one flexure arm 58 at the junction with first stable end 56. If the bellows input port 54 is held fixed when a compressible fluid enters bellows 52 sealed end 51 exerts a force on flexible arm 58 deflecting it from perpendicular to first stable end 56. The deflection near the first stable end 56 translates to a larger horizontal deflection at the second stable end 60. This deflection is mirrored in the movement of the movable-finger tip 40. The only parts of the effector mechanism 50 that move are the bellows 52 which expand slightly to exert force on the flexible arm 58 and the second stable end 60 which moves because the flexible arms 58 deflect. Therefore, this movement is free of any friction that could create particulate matter that could contaminate the wafer.

Figure 6:
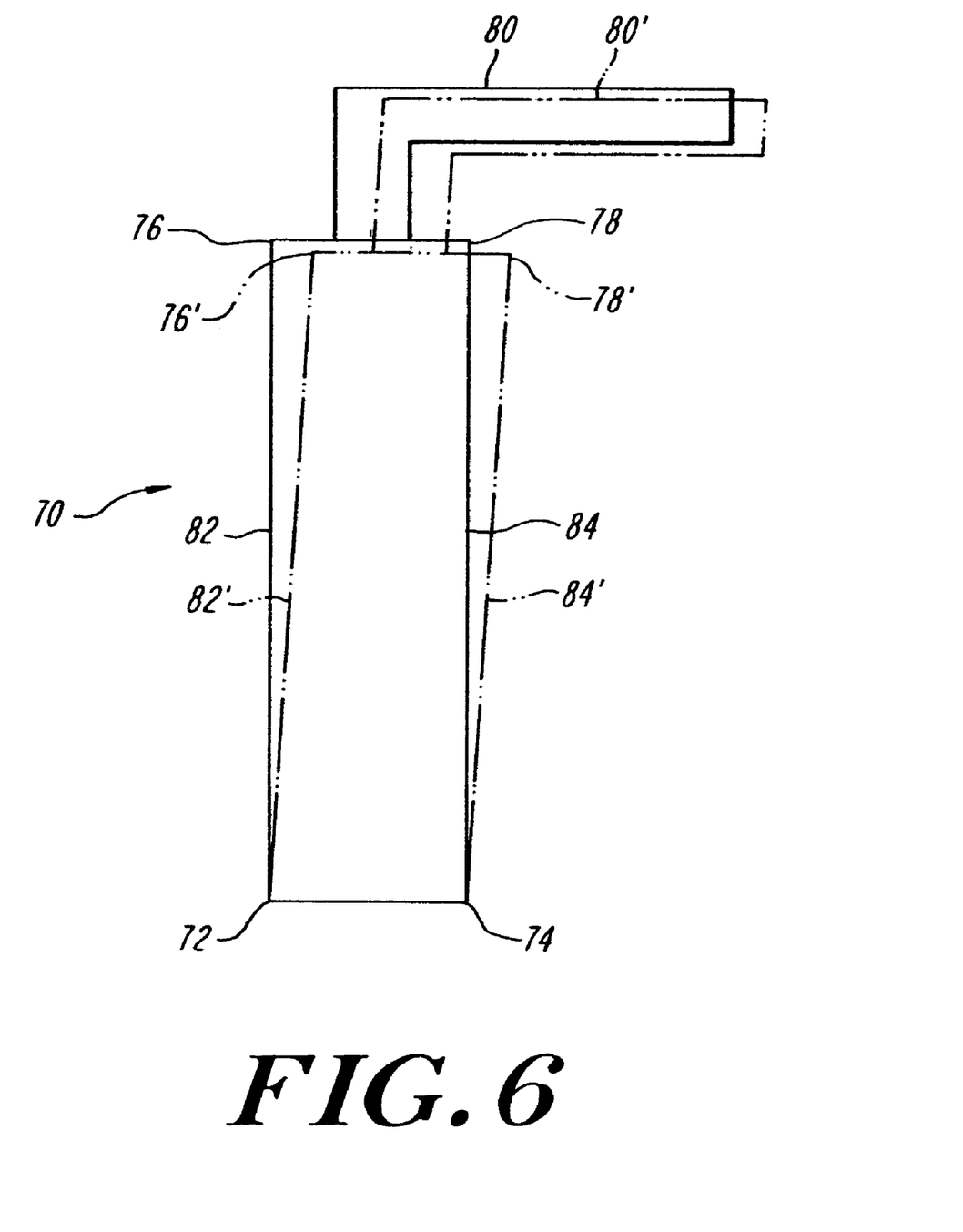
FIG. 6 illustrates the flexing of the flexure hinge when the bellows applies force.

The flexure arms and stable ends 56 and 60 form a parallelogram that is a rectangle at rest. Because of the flexible notch 53, the flexure arm/fixed end junction can be flexed when the compressible fluid in the bellows 52 applies pressure. FIG. 6 illustrates how the bellows 52 moves the flexure arm 58. The flexed end 56 has corners 72 35 and 74. At rest the flexure arms are in position 82 and 84 attached to the movable stable end 60 having corners 76 and 78. When the parallelogram is flexed, points 72 and 74 remain stationary while points 76 and 78 are moved to new position 76' and 78' displaced and slightly lower than the position 76, and 78. Finger 18 is shown in its relaxed position 80 and its displaced position 80'. It can be seen that a small initial displacement of flexure arms 82 and 84 near the fixed end 72/74 causes a larger displacement 76 to 76' at the far end of the arm. Displacement of the tip is given by:

$$x = L \sin(\theta) \qquad \text{Eq. 1}$$

where theta is the displacement angle at the fixed end, theta is defined by the material from which the effector mechanism is fabricated, $$Theta = \frac{M \times 9 \times \pi \times R^5}{2 \times E \times b \times t^{(\frac{5}{2})}} \qquad \text{Eq. 2}$$

E is the Young's modulus of the material and M is the bending moment of each of the notches expressed as $$m = \frac{F \times L1}{2}. \qquad \text{Eq. 3}$$

The remaining variables are illustrated on FIG. 5.

In one embodiment, using 70–79 T6 Aluminum and variables of L=2.5 in., R=0.375 in., t=0.0125 in., b=0.25 in., L1=0.602 in. and F=5 lb., the tip will move 0.707 in.

The above equations apply when bellows 52 are mounted further away from the fixed end 56 than shown in FIG. 5. This may be desirable for a modified mounting arrangement and alternate compressible fluids.

Figure 8:
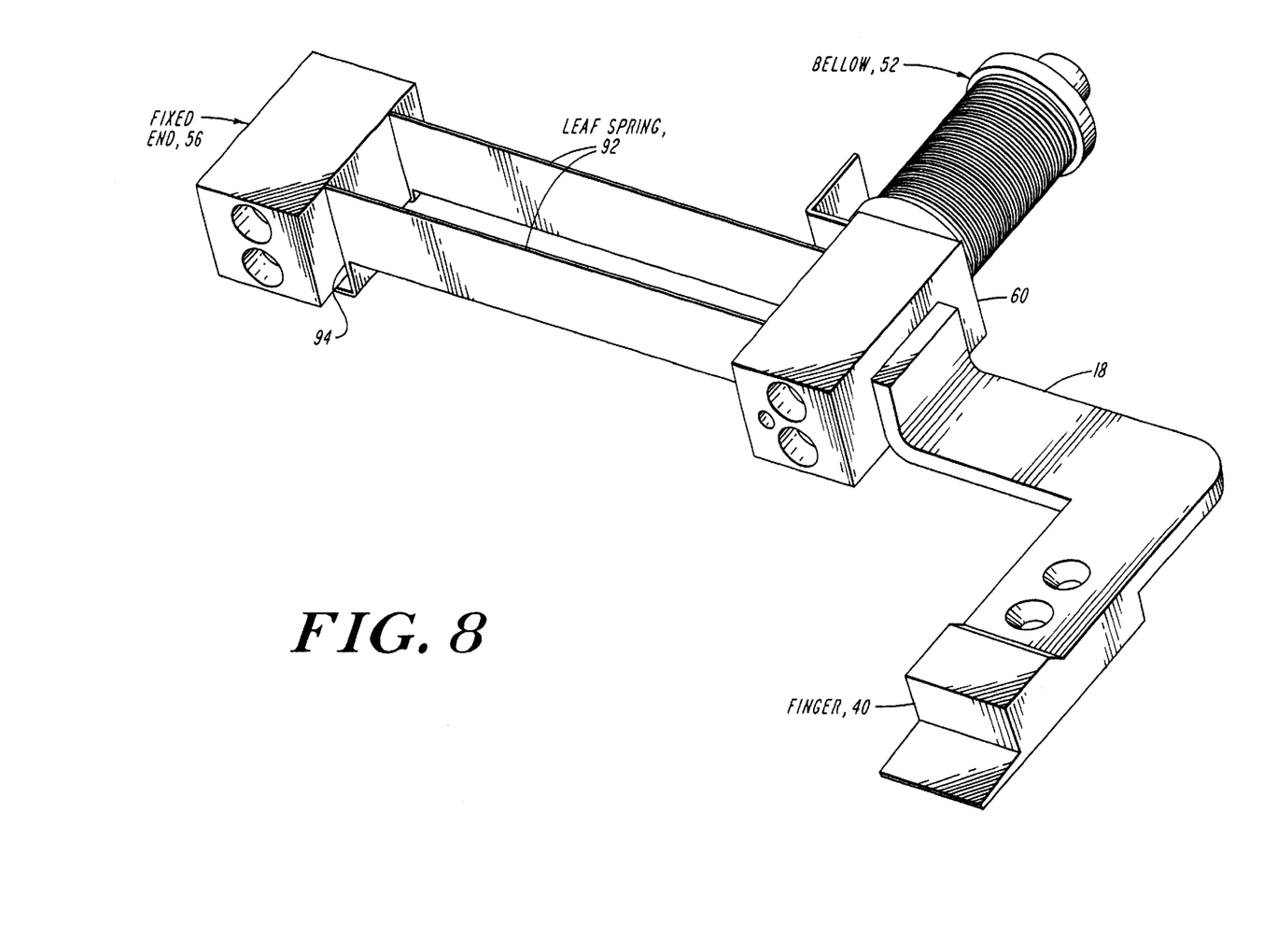
FIG. 8 shows an alternate embodiment of a flexure hinge.

An alternate embodiment of the effector mechanism is illustrated in FIG. 8. Here, the flexure hinge 50 is no longer machined from a single piece of material, and the flexible arms 92 are made of thin flexible metallic material. The stable ends 56 and 60 can be implemented essentially as implemented in the previous embodiment, while the flexible arms 92 are now attached to the stable ends 56 and 60 such as by brazing, or being bolted on. In this embodiment, the bellows are mounted to the movable stable end 60. The operation of this flexure hinge is similar to other implementations. When the bellows 52 expands, it places force on the movable stable end 60. When the flexible arms 92 are made of leaf spring material, the force of the bellows displaces the movable stable end. The flexible arms assure that the displacement is along the correct axis and that the movable end returns to the rest position when the force is removed.

Figure 7:
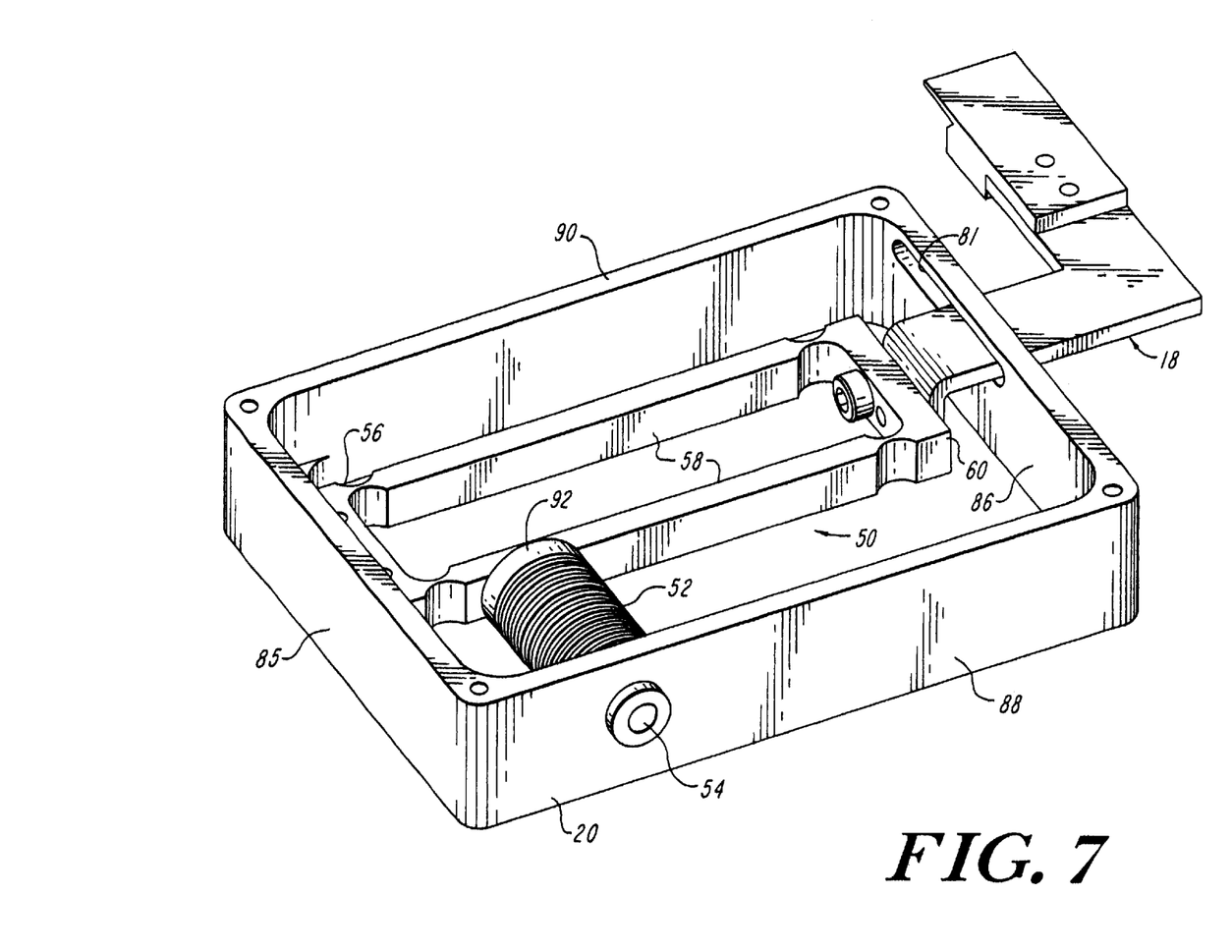
FIG. 7 shows the effector mechanism mounted in a housing with the moving finger led outside the housing.

A mounting mechanism 20 is provided for the effector mechanism 50 as illustrated in FIG. 7. The fixed stable end 56 is mounted to one wall 85 of the mounting mechanism 20. A slot 82 in the opposite wall 81 of the mounting mechanism 20 allows the moving finger 18 to pass through the enclosure. The bellows 52 is mounted between a flexure arm 58 and a sidewall 54 with the intake 54 passing through the sidewall 88. When compressible fluid is forced into bellows 52, the flexure arm 58 is deflected and the moving finger 18 holding the moving-finger tip 40 is deflected a larger amount engaging the wafer edge 14 and pushing the wafer 15 into the notches 34 in the fixed fingers 16. The force exerted by the moving-finger tip 40 is sufficient to displace the flexure tip 39 holding it in tension until the moving-finger tip 40 releases the wafer edge 14. The paddle arm assembly provides a suitable platform for the mounting of sensors such as ones to detect a wafer, detect closed fingers or detect open fingers, as may be needed to assure correct operation of the apparatus.

It will now become apparent to those of ordinary skill in the art that other embodiments incorporating these concepts may be used. Accordingly, it is submitted that the invention should not be limited by the described embodiments but rather should only be limited by the spirit and scope of the appended claims.

What is claimed is:

1. An edge gripping wafer handling apparatus for selectively securing and transporting wafers comprising:
   a paddle arm configured to be supported and moved by a wafer handling apparatus;
   a plurality of fixed fingers attached to said paddle arm operative to engage an edge of a wafer, wherein each fixed finger of said plurality of fixed fingers has a face comprising a beveled finger edge to slideably engage said wafer, a finger wafer notch operative to secure said wafer and a flexible portion extending toward said face and terminating beyond said finger wafer notch and before said beveled finger edge;
   a moving finger operable to engage said edge of said wafer through movement towards said plurality of fixed fingers;
   wherein only said edge, extending around a circumference of said wafer, is gripped by said moving finger and said plurality of fixed fingers and engaging results from said movement of said moving finger towards said fixed fingers.

2. The apparatus of claim 1 wherein said paddle arm has a length greater than the diameter of said wafer.

3. The apparatus of claim 1 wherein a distal end of said paddle arm is forked forming tines and said plurality of fixed fingers are disposed with one of said plurality of fixed fingers per tine of said forked distal end.

4. The apparatus of claim 1 wherein said paddle arm comprises a material of sufficient strength to remain rigid under operational conditions.

5. The apparatus of claim 1 wherein said plurality of fixed fingers and said moving finger are disposed on said paddle arm to be positioned on substantially opposed edges of said wafer.

6. The apparatus of claim 1 wherein said plurality of fixed fingers is two fixed fingers.

7. The apparatus of claim 1 wherein said plurality of fixed fingers are made of non-conductive, non-static, non-particulate generating polymer.

8. The apparatus of claim 1 wherein said plurality of fixed fingers are made of PEEK.

9. The apparatus of claim 1 wherein said finger wafer notch is V-shaped and an opening of said finger wafer notch is greater than a width of said wafer.

10. The apparatus of claim 1 wherein said flexible portion is configured to be displaced to said wafer edge when said wafer edge is secured in said finger wafer notch.

11. The apparatus of claim 1 wherein said moving finger is terminated by a moving finger tip having a face comprising a beveled finger edge operative to slideably engage said wafer and a finger wafer notch operative to secure said wafer.

12. The apparatus of claim 11 wherein said moving finger tip is made of PEEK.

13. The apparatus of claim 11 wherein said beveled finger edge is angled towards said finger wafer notch and said finger wafer notch extends across said face of said moving finger tip such that said beveled finger edge disposes said wafer into contact with said finger wafer notch as said beveled finger edge is slideably engaged with said wafer.

14. The apparatus of claim 1 wherein said moving finger is disposed on an effector mechanism attached at a proximate end of said paddle arm, said effector mechanism comprising a flexure hinge structured for resilient movement and a bellows configured for expansionary displacement, said bellows operable to move said flexure hinge by said expansionary displacement and said flexure hinge comprising a fixed end and a movable end.

15. The apparatus of claim 14 wherein said expansionary displacement is provided by a compressible fluid forced into said bellows.

16. The apparatus of claim 15 wherein said compressible fluid is compressed air and said bellows has a compressed air entry aperture at an end distal from said flexure hinge.

17. The apparatus of claim 14 wherein said flexure hinge further comprises at least one flexure arm of a leaf spring material disposed between said fixed end and said movable end, said leaf spring material produced for temporary deflection.

18. The apparatus of claim 17 wherein said temporary deflection provides a resilient movement of said flexure hinge.

19. The apparatus of claim 18 wherein said resilient movement is smooth and creates no particulate matter.

20. The apparatus of claim 14 wherein said effector mechanism is cased in an enclosure, said enclosure mounted to said proximate end of said paddle arm, and said hinge fixed end attached to said enclosure and said movable end attached to said moving finger, said moving finger passing through a slot in said enclosure.

21. The apparatus of claim 1 wherein said flexible portion has a flexible tip constructed to retract when a force is applied radially and return to a rest position when said force is removed.

22. A method for gripping a wafer comprising:

disposing a paddle arm/finger assembly below said wafer and aligned such that a face of each finger of a set of fingers, comprising one moving finger and a plurality of fixed fingers, of said finger assembly are proximate but external to a circumference of said wafer;

raising said paddle arm/finger assembly until a beveled finger edge disposed below said face on each finger of said set of fingers is abutting a lower surface of said circumference of said wafer;

moving said moving finger toward a center of said wafer to engage said circumference of said wafer in a notch in said face of said moving finger until said circumference of said wafer engages all faces of said plurality of fixed fingers, wherein each fixed finger of said plurality of fixed fingers has a finger wafer notch in said face operative to secure said wafer and a flexible portion extending toward said face and terminating beyond said finger wafer notch and before said beveled finger edge;

continuing said movement of said moving finger until said circumference of said wafer is secured in said finger wafer notches and said flexible portion is displaced by said wafer circumference.

23. An edge gripping wafer handling apparatus for selectively securing and transporting wafers comprising:

a paddle arm configured to be supported and moved by a wafer handling apparatus;

a plurality of fixed fingers attached to said paddle arm operative to engage an edge of a wafer;

a moving finger operable to engage said edge of said wafer through movement towards said plurality of fixed fingers, wherein said moving finger is disposed on an effector mechanism attached at a proximate end of said paddle arm, said effector mechanism comprising a flexure hinge structured for resilient movement and a bellows configured for expansionary displacement, said bellows operable to move said flexure hinge by said expansionary displacement and said flexure hinge comprising a fixed end and a movable end;

wherein only said edge, extending around a circumference of said wafer, is gripped by said moving finger and said plurality of fixed fingers and said engaging results from said movement of said moving finger towards said fixed fingers.

24. The apparatus of claim 23 wherein a distal end of said paddle arm is forked forming tines and said plurality of fixed fingers are disposed with one of said plurality of fixed fingers per tine of said forked distal end.

25. The apparatus of claim 23 wherein said plurality of fixed fingers and said moving finger are disposed on said paddle arm to be positioned on substantially opposed edges of said wafer.

26. The apparatus of claim 23 wherein said plurality of fixed fingers is two fixed fingers.

27. The apparatus of claim 23 wherein said plurality of fixed fingers are made of non-conductive, non-static, non-particulate generating polymer.

28. The apparatus of claim 23 wherein said plurality of fixed fingers are made of PEEK.

29. The apparatus of claim 23 wherein each fixed finger of said plurality of fixed fingers has a face comprising a beveled finger edge to slideably engage said wafer and a finger wafer notch operative to secure said wafer.

30. The apparatus of claim 29 wherein said finger wafer notch is V-shaped and an opening of said finger wafer notch is greater than a width of said wafer.

31. The apparatus of claim 29 wherein each fixed finger has a flexible portion extending toward said face and terminating beyond said finger wafer notch and before said beveled finger edge.

32. The apparatus of claim 31 wherein said flexible portion is configured to be displaced to said wafer edge when said wafer edge is secured in said finger wafer notch.

33. The apparatus of claim 31 wherein said flexible portion has a flexible tip constructed to retract when a force is applied radially and return to a rest position when said force is removed.

34. The apparatus of claim 23 wherein said moving finger is terminated by a moving finger tip having a face comprising a beveled finger edge operative to slideably engage said wafer and a finger wafer notch operative to secure said wafer.

35. The apparatus of claim 34 wherein said beveled finger edge is angled towards said finger wafer notch and said finger wafer notch extends across said face of said moving finger tip such that said beveled finger edge disposes said wafer into contact with said finger wafer notch as said beveled finger edge is slideably engaged with said wafer.

36. The apparatus of claim 23 wherein said expansionary displacement is provided by a compressible fluid forced into said bellows.

37. The apparatus of claim 36 wherein said compressible fluid is compressed air and said bellows has a compressed air entry aperture at an end distal from said flexure hinge.

38. The apparatus of claim 23 wherein said effector mechanism is cased in an enclosure, said enclosure mounted to said proximate end of said paddle arm, and said hinge fixed end attached to said enclosure and said movable end attached to said moving finger, said moving finger passing through a slot in said enclosure.

* * * * *

UNITED STATES PATENT AND TRADEMARK OFFICE
CERTIFICATE OF CORRECTION

PATENT NO.     : 6,491,330 B1                                            Page 1 of 1
DATED          : December 10, 2002
INVENTOR(S)    : Anil Mankame et al.

It is certified that error appears in the above-identified patent and that said Letters Patent is hereby corrected as shown below:

Column 2,
Line 56, "from below. P The" should read -- from below. The --;

Column 3,
Lines 24-25, "side 27 of the body." should read -- side of the body 27. --;
Line 63, "portion 44 of its radial face." should read -- portion of its radial face 44. --; and Column 4,
Line 50, "72 35 and 74." should read -- 72 and 74 --.

Signed and Sealed this

Seventh Day of October, 2003

JAMES E. ROGAN
*Director of the United States Patent and Trademark Office*